United States Patent
Sakiyama

(10) Patent No.: US 7,202,686 B2
(45) Date of Patent: Apr. 10, 2007

(54) SOCKET AND TEST APPARATUS

(75) Inventor: Shin Sakiyama, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/337,895

(22) Filed: Jan. 23, 2006

(65) Prior Publication Data

US 2006/0121752 A1 Jun. 8, 2006

Related U.S. Application Data

(63) Continuation of application No. PCT/JP2004/09935, filed on Jul. 12, 2004.

(30) Foreign Application Priority Data

Jul. 29, 2003 (JP) .............................. 2003-282139

(51) Int. Cl.
*G01R 31/02* (2006.01)

(52) U.S. Cl. ...................................................... 324/761

(58) Field of Classification Search ................ None
See application file for complete search history.

(56) References Cited

U.S. PATENT DOCUMENTS

| | | | | |
|---|---|---|---|---|
| 5,137,454 A | * | 8/1992 | Baechtle | 439/62 |
| 5,746,608 A | * | 5/1998 | Taylor | 439/70 |
| 6,043,666 A | * | 3/2000 | Kazama | 324/754 |
| 6,045,416 A | * | 4/2000 | Sinclair | 439/857 |
| 6,249,135 B1 | * | 6/2001 | Maruyama et al. | 324/765 |
| 6,504,389 B1 | * | 1/2003 | Hembree | 324/755 |
| 6,750,672 B2 | * | 6/2004 | Tanimura et al. | 324/765 |
| 6,825,052 B2 | * | 11/2004 | Eldridge et al. | 438/15 |
| 6,827,586 B2 | * | 12/2004 | Noda et al. | 439/71 |
| 2005/0077905 A1 | * | 4/2005 | Sasaki | 324/500 |

FOREIGN PATENT DOCUMENTS

| | | |
|---|---|---|
| JP | 4-118586 | 10/1992 |
| JP | 8-88063 | 4/1996 |
| JP | 9-308050 | 11/1997 |
| JP | 2000-331732 | 11/2000 |
| JP | 2001-305182 | 10/2001 |
| JP | 2002-156387 | 5/2002 |

(Continued)

OTHER PUBLICATIONS

Partial English translation of Korean Office Action issued Apr. 28, 2006 in corresponding Korean patent application (1 page).

(Continued)

*Primary Examiner*—Ha Tran Nguyen
*Assistant Examiner*—Richard Isla-Rodas
(74) *Attorney, Agent, or Firm*—Osha Liang LLP

(57) ABSTRACT

A socket electrically coupled to a BGA unit includes a plurality of ball contacts including a housing wherein a through-hole having a larger diameter than that of the ball contact is formed in a surface of the housing, which faces the BGA unit, in order to the through-hole corresponds the plurality of ball contacts and a pin contact provided in a plurality of through-holes and contacting a corresponding side part of the ball contact. More desirably, the plurality of pin contacts is provided in order that each extending directions of the pin contacts are opposite to one another.

16 Claims, 11 Drawing Sheets

FOREIGN PATENT DOCUMENTS

| | | |
|---|---|---|
| JP | 2002-367746 | 12/2002 |
| JP | 2003-123924 | 4/2003 |
| JP | 2004-39564 | 2/2004 |
| KR | 2003-28709 | 4/2003 |

OTHER PUBLICATIONS

International Search Report issued for International application No. PCT/JP2004/009935 and English translation thereof, 4 pages.

* cited by examiner

CENTRE OF
THE OPENING

SOCKET AND TEST APPARATUS

CROSS REFERENCE TO RELATED APPLICATION

This is a continuation application of PCT/JP2004/009935 filed on Jul. 12, 2004, which claims priority from a Japanese Patent Application No. JP 2003-282139 filed on Jul. 29, 2003, the contents of which are incorporated herein by reference.

BACKGROUND OF THE INVENTION

1. Field of the Invention

The present invention relates to a socket electrically coupled to an electronic device. More particularly, the present invention relates to a socket electrically coupled to an electronic device which includes a BGA (Ball Grid Array) unit. In addition, the present application claims the benefit of, and priority to, Japanese patent application No. 2003-282139 filed on Jul. 29, 2003, the entire contents of which are incorporated herein by reference for all purposes.

2. Related Art

Conventionally, when a semiconductor chip including a BGA unit is tested, a socket for testing IC is used in order to send and to receive a signal to/from the semiconductor chip. In this case, as the contact of the socket corresponding to the ball contact, a POGO pin and an electrode pad are known.

The POGO pin electrically connects the tip of the pin into contact with the ball contact of the BGA and by pressing. The electrode pad electrically connects a plane electrode to the apex of the ball contact.

However, according to the conventional POGO pin, the ball contact is easy to damage because the tip of the pin contact pierces the ball contact in case of contacting. Moreover according to the electrode pad, a foreign substance is easy to adhere to the electrode. For this reason, according to the test of the semiconductor chip which has to be coupled to the multiple electrodes, the problem such as the reliability or durability of contacting will be occurred.

SUMMARY OF THE INVENTION

Therefore, it is an object of the present invention to provide a socket and a test apparatus, which are capable of overcoming the above drawbacks accompanying the conventional art. The above and other objects can be achieved by combinations described in the independent claims. The dependent claims define further advantageous and exemplary combinations of the present invention.

According to a first aspect of the present invention, a socket which is electrically coupled to a BGA unit including a plurality of ball contacts includes a housing wherein a plurality of through-holes having a larger diameter than that of the ball contact is formed in a surface of said housing, which faces the BGA unit, in order that the through-hole corresponds to the plurality of ball and a plurality of pin contacts which is provided in the plurality of through-holes and contacts a corresponding side part of the ball contact.

The pin contact may include a locking section which is locked on a rear face of said housing, a curved face section including a curved face to be in contact with the ball contact and an elastic section which extends from the locking section to the curved face section and has an elastic restoring force.

A circular opening of the through-hole may be formed on the surface of the housing and the apex of the curved face section in a direction from the housing to the BGA unit may be formed at the edge than at the centre of the opening in the through-hole. The position of the locking section on the inner face parallel to the surface of the housing may be opposite to the apex of the curved face section according to the centre of the opening.

The pin contact may be provided in order that in a face parallel to a surface of the housing, an extending direction facing the curved section from the locking section slants regarding an arrangement direction of the plurality of through-holes. In addition, the plurality of pin contacts is provided in order that each of the extending directions of the pin contacts, which are provided in the through-holes adjacent to each other, is in opposite to each other.

It is desirable that the height of an apex of the curved face section in a direction from the housing to the BGA unit should be lower than the surface of the housing. In addition, the socket may further include a contact holding section which is integrally formed with a side face of the through-hole and determines an angle of the elastic section by contacting the elastic section from the locking section side in s state that the pin contact is not in contact with the ball contact.

The contact holding section may include substantially the angle same as the elastic section is to be provided and a contacting face on which it contacts the elastic section. In addition, the circular opening of which the edge is notched may be formed on the surface of the housing.

The pin contact may include a board-side contacting section formed on a bottom face of an area of the locking section, which is substantially parallel to the rear face of the housing, and electrically contacts external board, which is electrically coupled to the BGA unit.

The housing may hold the pin contact so that the pin contact is freely movable in a contact direction in which the pin contact is coupled to the ball contact. In addition, the socket may further include a locking sheet fixed in order to cover the rear face of the housing, wherein an opening is formed in a position of the locking sheet corresponding to the pin contact and the pin contact may include a projecting piece section which is wider than the opening and an area of the pin contact, which is lower than the projecting piece section, is narrower than the opening.

A fitting groove, into which a part of the pin contact is inserted, may be formed on a rear face of the housing and the pin contact may include a locking section of which a part is inserted into the fitting groove, a curved face section including a curved face to be in contact with the ball contact and an elastic section which extends from the locking section to the curved face section and has an elastic restoring force and the protruding piece section is formed in the upper part of first area of the locking section, which is inserted into the fitting groove, and the second are of the locking section is narrower than the opening.

The opening may be formed in a position of the locking sheet corresponding to said locking section in order that the opening is wider than the locking section, the locking section may be include an area inserted into the fitting groove and an area substantially parallel to the rear face of said housing, and the pin contact may further include a board-side contacting section formed on the bottom face of an are of the locking section, which is substantially parallel to the rear face of the housing and electrically contacts an external board which is electrically coupled to the BGA unit.

The housing may include a protruding section protruding towards the pin contact on a lower part of the fitting groove, which is provided on a rear face of the housing and a part of the pin contact is inserted into and the pin contact may include a locking section inserted into the fitting groove and a locking claw formed in the locking section and protrudes towards the protruding section.

According to a second aspect of the present invention, a test apparatus for testing electronic device including a plurality of ball contacts includes a socket electrically coupled to the electronic device, a pattern generating unit for generating a test pattern supplied to the electronic device and supplying said test pattern to the electronic device via the socket and a determining unit for receiving an output signal outputted from the electronic device in response to the test pattern via the socket and determining pass or fail of the electronic device based on the output signal, wherein the socket includes a housing, where a plurality of through-holes having a larger diameter than that of the ball contact are formed in a surface of the housing, which faces the electronic device, in order that plurality of through-holes correspond to the plurality of ball contacts and the plurality of pin contacts provided in the plurality of through-holes and contacting side part of the ball contacts.

The test apparatus may further include a socket board coupled to a back face of the socket and receives and sends a signal between the electronic device and the test apparatus and the pin contact may include a board-side contacting section electrically coupled to the socket. The pin contact may further include a locking section locked on the rear face of the housing and a board-side contacting section may be formed on a bottom face of an area of the locking section to be in contact with the rear face of the housing in the locking section and electrically contact socket.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 3 shows a pin contact which is formed at a through-hole 24.

FIG. 8 shows another example of a housing 22 and a pin contact 50.

FIG. 9 shows the free movement of a pin contact 50.

FIG. 11 shows an example of the configuration of a pin contact explained in FIG. 10 and a fitting groove 32.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
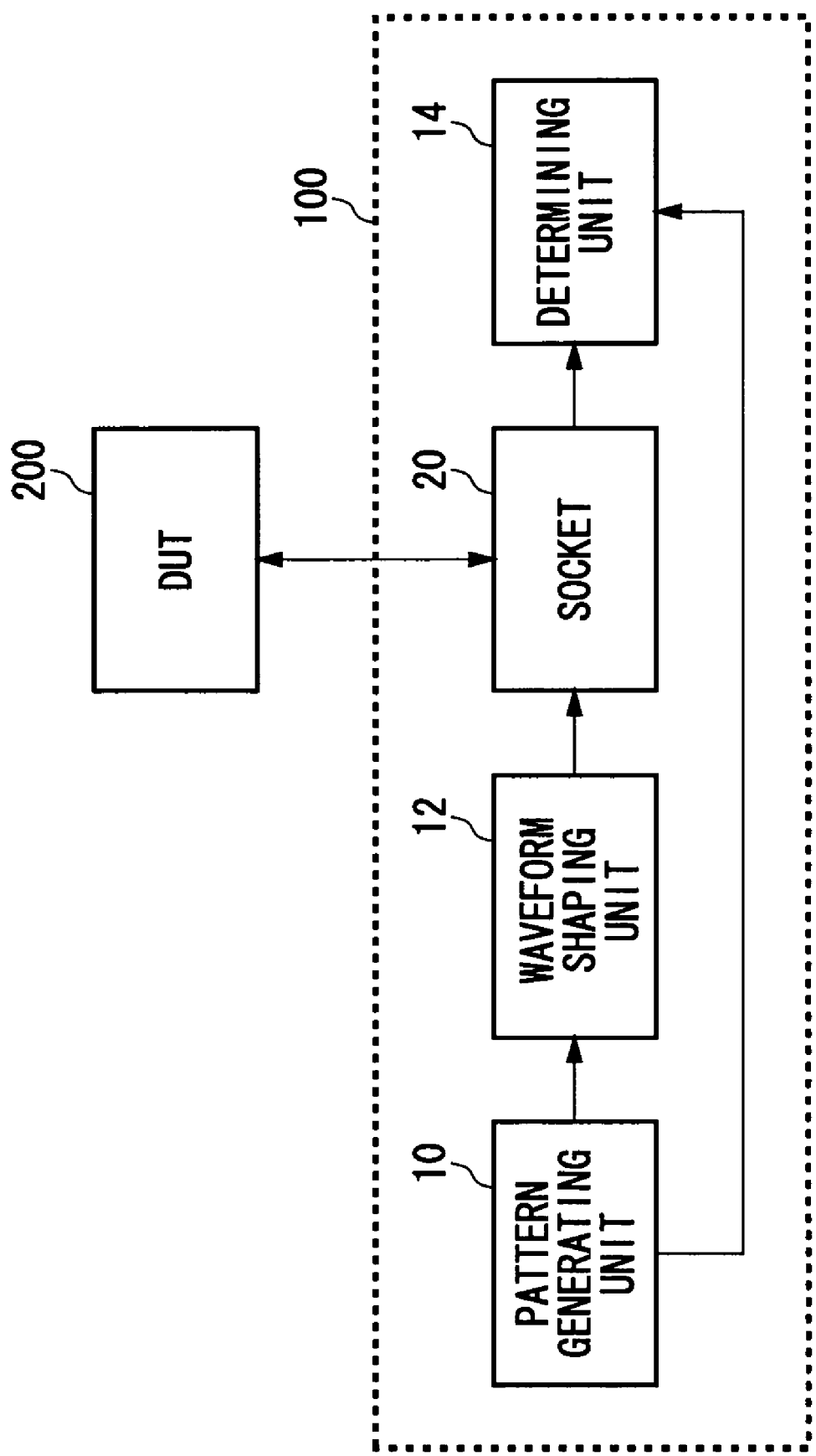
FIG. 1 shows an example of the configuration of a test apparatus 100 according to an embodiment of the present invention.

FIG. 1 shows an example of the configuration of a test apparatus 100 according to an embodiment of the present invention. The test apparatus 100 tests an electronic device 200 including a BGA unit including a plurality of ball contacts. For example, the electronic device 200 is a device including a semiconductor circuit. In addition, the test apparatus 100 includes a pattern generating unit 10, a waveform shaping unit 12, a socket 20 and a determining unit 14.

The pattern generating unit 10 generates a test pattern supplied to the electronic device 200 and supplies it to the electronic device 200 via the waveform shaping unit 12 and the socket 20. For example, the pattern generating unit 10 generates the test pattern to be stored in the electronic device 200 such as a semiconductor memory. In addition, the pattern generating unit 10 generates an expected value signal which is to be outputted from the electronic device 200 in response to the test pattern and supplies it to the determining unit 14.

The waveform shaping unit 12 shapes the test pattern and supplies it to the socket 20 at the predetermined timing. The socket 20 is electrically coupled to the electronic device 200 and sends and receives a signal to/from the electronic device. In addition, the socket 20 may be coupled to the waveform shaping unit 12 and the determining unit 14 via a socket board. The socket board, on which the plurality of socket 20 is mounted perpendicularly receives and sends the signal from/to the plurality of electronic device 200.

The determining unit 14 receives the output signal outputted from the electronic device 200 in response to the test pattern and determines pass or fail of the electronic device 200 based on the result of comparing the output signal with the expected value signal.

Figure 2:
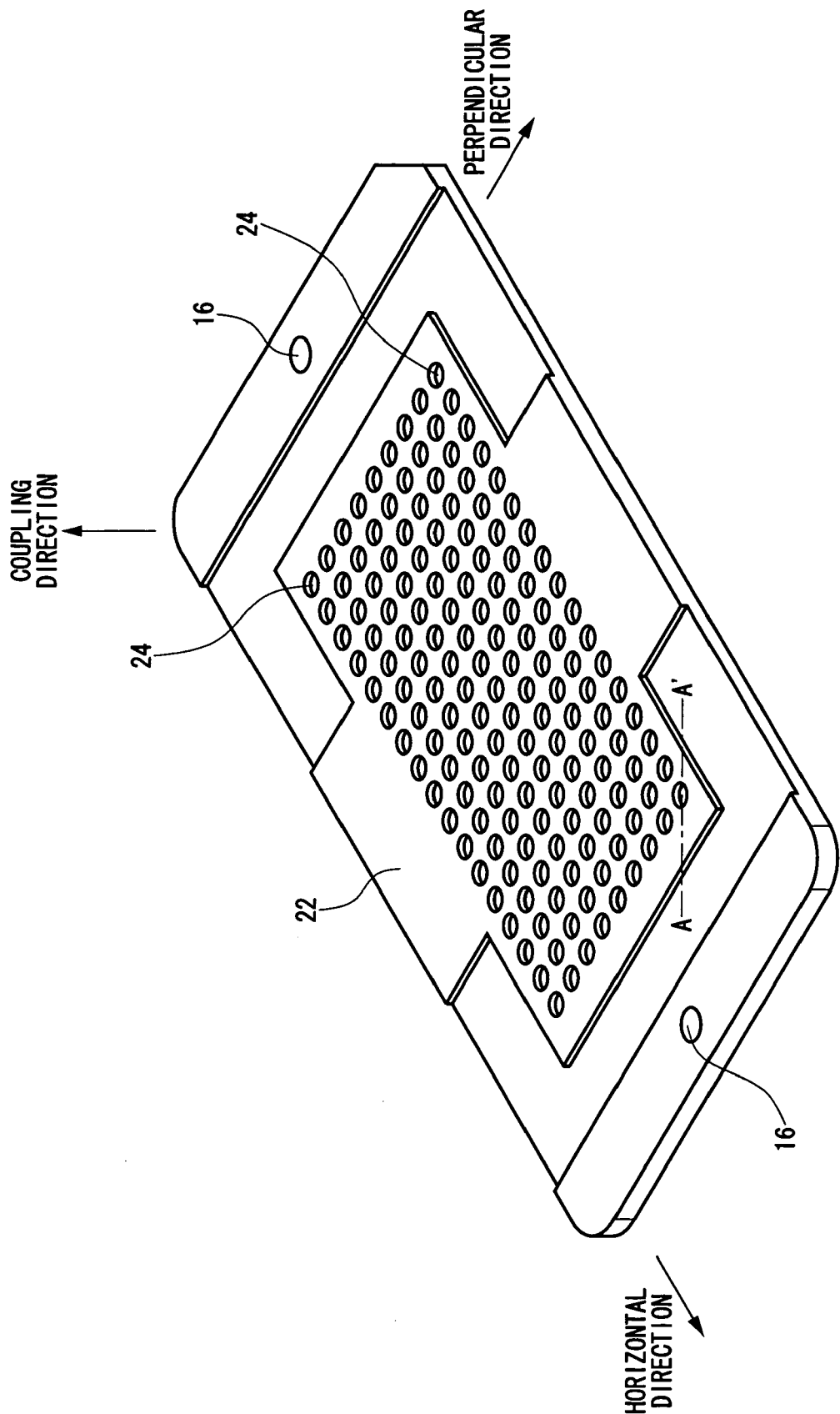
FIG. 2 shows an example of a perspective view of a housing 22 of a socket 20.

FIG. 2 shows an example of a perspective view of a housing 22 of the socket 20. The socket 20 is electrically coupled to a BGA unit including a plurality of ball contacts. The socket 20 includes the housing 22 and a pin contact. A plurality of through-holes 24 having a larger diameter than that of the ball contact are formed in a surface of the housing, which faces the BGA unit, in order that the through-hole corresponds to the ball contact. The pin contact is provided in the through-hole 24. In addition, a fitting hole 16 for locking the socket 20 in the socket board is formed on the housing 22.

The plurality of though holes 24 is continuously formed in the predetermined perpendicular and horizontal directions in the housing 22. These through-holes 24 are formed in the perpendicular and horizontal directions in order to have a predetermined interval, respectively. Here, the perpendicular and horizontal directions indicate the directions in the surface of the housing 22 perpendicular to a coupling direction in which the socket 20 is coupled to the BGA unit. In addition, the perpendicular and horizontal directions indicate the directions in which the interval of the through-holes is minimized. For example, although the plurality of through-holes 24 are formed in a slanted direction regarding perpendicular and horizontal directions in order to have a predetermined interval, the interval is larger than that of perpendicular and horizontal directions.

In addition, the socket 20 further includes the plurality of pin contacts which are formed inside of the plurality of through-holes 24 and contact corresponding ball contacts. The ball contacts of the BGA unit are electrically coupled to the pin contacts internal of the through-holes respectively so that the electronic device 200 is electrically coupled to the test apparatus 100. Next, the pin contacts internal of the through-hole 24 are described.

Figure 3A:
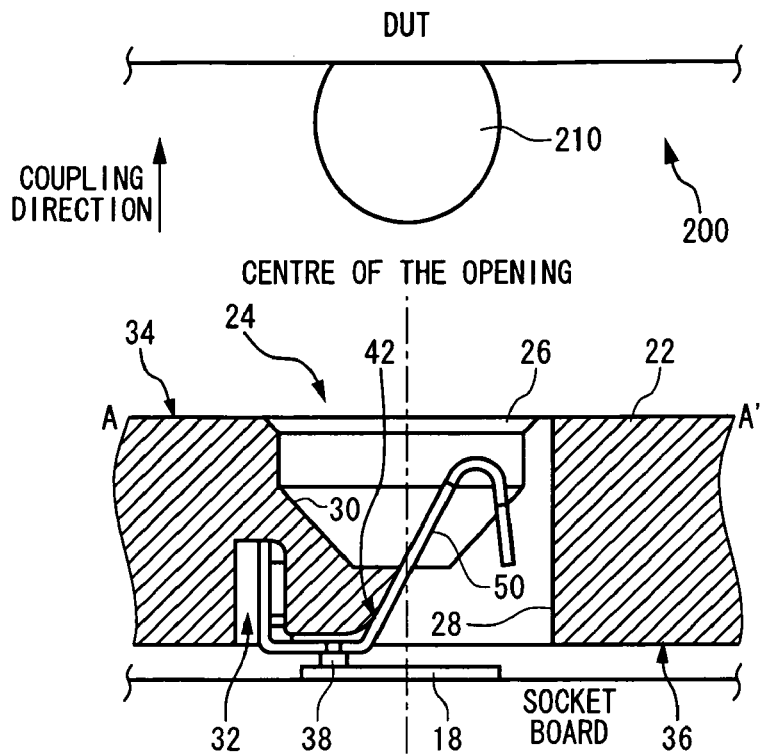
FIG. 3A shows a section of a through-hole 24.
Figure 3B:
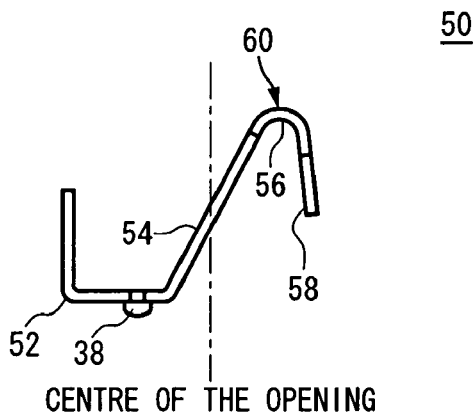
FIG. 3B shows an example of a sectional view of a pin contact and FIG. 3C shows an example of a perspective view of a pin contact.
Figure 3C:
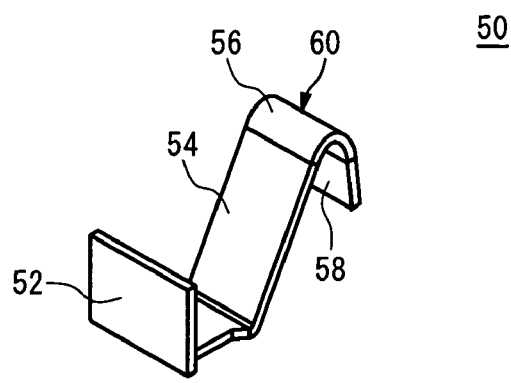

FIG. 3 shows the pin contact which is formed in the through-hole 24. FIG. 3A is a cross section taken on line A–A' of FIG. 2. In addition, FIG. 3B shows an example of a sectional view of a pin contact and FIG. 3C shows an example of a perspective view of a pin contact.

In addition, for example, the through-hole 24 includes a circular opening on a surface 34 in the housing 22, a cylindrical hole having a predetermined depth extending from the surface 34 of the housing 22 and a conical hole extending from the cylindrical hole.

The pin contact 50 is formed inside of the through-hole 24. The housing 22 is insulation materials such as resin materials and the pin contact 50 is electrically insulated by forming the pin contact 50 in each through-hole, respectively. As shown in FIG. 3B, the pin contact 50 includes a locking section 52, an elastic section 54, a curved section 56, a terminal end section 58 and a board-side contacting section 38.

The locking section 52 is locked on a rear face 36 of the housing 22 and fixes the position of the pin contact 50. For example, a fitting groove 32 for fitting the locking section 52 is formed on the rear face 36 of the housing 22 and fits a part of the locking section 52 so that the position of the pin contact 50 is fixed. The locking section 52 may include a protrusion for fitting the fitting groove 32. For example, the locking section 52 includes a first area substantially parallel to the rear face 36 of the housing 22 and a second area inserted into the fitting groove 32. In this case, the locking section 52 inserted into the fitting groove 32 is fixed to be pressed in a horizontal direction from the fitting groove 32. Otherwise, the locking section 52 may be coupled to the contact board by moving upward or downward.

The curved section 56 includes a curved surface which contacts with a ball contact 210. The section of the curved face section 56 is a curve as shown in FIG. 3B. In addition, as shown in FIG. 3C, the curved face section 56, for example, has a form that one end of the plane-shaped conductive plate is bent in a predetermined direction. The curved face section 56 has an apex in a direction from the housing 22 to the electronic device 200 and the pin contact 50 is provided in order that the apex 60 is located at the edge than the centre of the opening. Here, it is desirable that the ratio between a distance from the apex 60 to the centre of the opening and a distance from the apex 60 to the side surface 28 of the through-hole 24 should be 1 to 3 substantially. The height of the apex 60 of the curved surface section 56 in a direction from the housing 22 to the electronic device 200, is lower than a surface 34 of the housing 22. In addition, a position of the locking section 52 in the plane parallel to the surface 34 of the housing 22 is opposite to the apex 60 of the curved surface section 56 on the basis of the centre of the opening.

The elastic section 54 is provided extending from the locking section 52 to the curved surface section 56. In addition, the elastic section 54 is formed of an elastic member having an elastic restoring force. When the curved surface section 56 is pressed by the ball contact 21, the elastic section 54 slides the curved surface section 56 depending on the pressure. That is, the curved surface section 56 makes slide contact on a slant face of the ball contact 210.

The terminal end section 58 is provided extending from the curved face section 56. In addition, the board-side contacting section 38 protrudes from the locking section 52 and electrically couples the socket 20 to the socket board by contacting a terminal 18 of the socket board. In this example, the board-side contacting section 38 is provided on a bottom face of the locking section 52 substantially parallel to the housing 22 and is electrically in contact with a terminal 18 of the external socket board to be electrically coupled to the BGA unit. In addition, it is desirable that the elastic section 54 should be provided along the straight line from the curved face section 56 to the locking section 52 in a state that the curved face section 56 is not pressed. The test apparatus 100 and the electronic device 200 are electrically coupled via the curved face section 56, the elastic section 54, the locking section 52 and the board-side contacting section 38. The elastic section 54 couples the curved face section 56 to the locking section 52 in the shortest distance so that it reduces a noise generated in a transmitting signal and can test the electronic device 200 operating at a high frequency. In addition, according to the pin contact 50 in this example, even when the difference occurs in the size of the ball contact 210, it is possible that the stability of coupling is ensured and the ball contact 210 is coupled to the test apparatus 100 by the fixed shortest route. Moreover, since the through-hole 24 is provided in a state that a part or a large part of the ball contact 210 is inserted into the housing 22, it is possible that the pin contact 50 becomes shorter and adapts to a higher frequency.

In addition, the opening of the through-hole 24 has a notch 26 which is formed at the edge of the surface 34 of the housing 22. For example, the edge section is notched in order that all corners of the edge of the opening in the through-hole 24 are chamfered. For this reason, even when the position of the ball contact 210 is not fitted to the through-hole 24 and the ball contact 210 is pressed, the ball contact 210 can be guided into the through-hole 24 without damaging the ball contact 210.

In addition, any structure which allows to provide a good electrical contact between the apex 60 and the curved face section 56 which are in slide-contact with the ball contact 210 may be provided according to need. That is, a surface processing may be performed in order that the oxide film of the ball contact 210 can be more precisely removed by sliding, for example, a streak trench or a plurality of projected structures may be formed.

Figure 4:
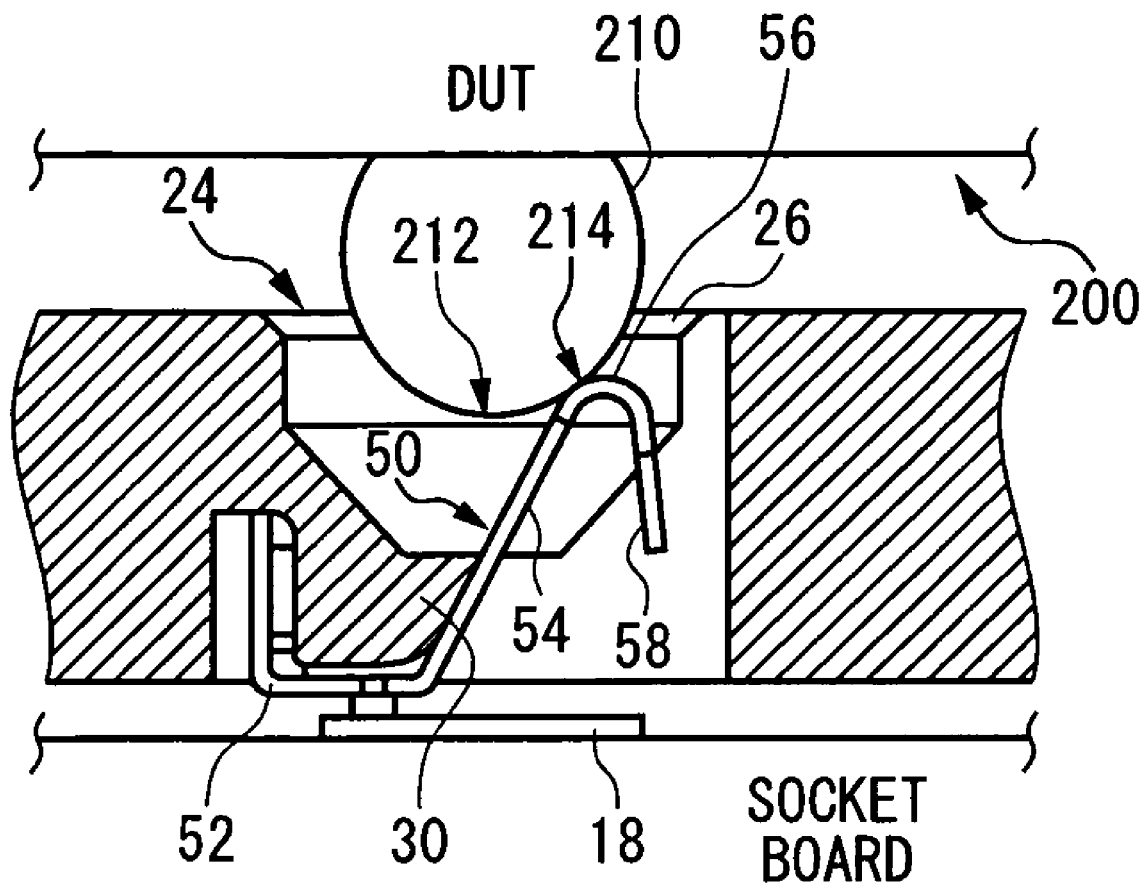
FIG. 4 shows a section of a through-hole 24 in case that a pin contact 50 contacts with a ball contact 210.

FIG. 4 shows a section of the through-hole 24 in case that the pin contact 50 contacts the ball contact 210. The curved surface section 56 of the pin contact 50 contacts the side section 214 of the ball contact 210. For example, the side section 214 of the ball contact 210 is a portion at which a normal line on the outer peripheral face of the ball contact 210 is not parallel to the coupling direction. In addition, as above description, when the curved face section 56 is pressed by the ball contact 210, the elastic section 54 slides the curved face section 56 depending on the pressure.

The positions in the sliding direction and the horizontal direction of the curved face section 56 are changed by sliding the curved face section 56. Although excessive pressure is applied on the curved face section 56 by changing the position of the couplingdirection of the curved face section 56 depending on the pressure, it is possible that the damage of the pin contact 50 and the ball contact 210 is prevented. In addition, since the position in the horizontal direction of the curved face section 56 is changed depending on the pressure, it is possible that the position of the ball contact 210 contacting the curved face section depending on the pressure is changed and the pressure between the ball contact 210 and pin contact 50 in the coupling direction is kept substantially constant. Moreover, in this example, although the pin contact 50 contacts the side section of the ball contact 210 by the curved face, it is possible that the surface of the ball contact 210 is wiped by sliding of the curved face section 56. Accordingly, for example, it is possible that the oxide film on the surface of the ball contact 210 is removed and the reliability of coupling between the curved face surface and the ball contact 210 is improved.

In addition, since the ball contact 210 is slidably pressed to the slope of the curved face section 56, the length which can be utilized for the electrical contact in the pressing direction may be lengthened. As a result, since the available contact area becomes large even when a difference of the height is occurred between the ball contact 210 and a large number of corresponding pin contacts, it is possible that stable contact reliability may be obtained. Accordingly, it is the structure having high contact reliability. In addition, since the elastic section 54 of the pin contact 50 predetermines an angle according to the contact holding section 30, the position on the curved face section 56 which contacts the ball contact 210 can be fixed so that the difference of the position can be reduced. Accordingly, it is possible that the stable contact reliability is obtained.

Moreover, the socket 20 includes the contact holding section 30 in each through-hole 24. The contact holding section 30 is integrally formed with a side face of the through-hole and determines an angle of the elastic section 54 in a state that the pin contact is not in contact with the ball contact 210 by contacting the elastic section from the locking section 52. Forexample, the contact holding section 30 includes a contacting face 42 which contacts the elastic section 54 (see FIG. 3) in a state that the pin contact 50 is not in contact with the ball contact 210. At this time, the contact face 42 is formed at substantially the same angle as an angle at which the elastic section is to be formed.

Since the elastic section 54 is in contact with the contact face 42 at all times, a function, so-called preload function, is provided. In this example, the contact holding section 30 is designed to apply a predetermined pressure to the elastic section 54 in the sliding direction of the curved face section 56 in a state that it contacts the ball contact 210. For this reason, although the elastic section 54 intends to be restored by an elastic restoring force in an opposite direction to the sliding, the restoring is restricted by the contact holding section 30. Accordingly, the angle of the elastic section 54 is determined by the contact holding section 30 and it is possible that the contact reliability between the pin contact 50 and the ball contact 210 is improved.

As described above, each contact holding section 30 maintains the angle of the elastic section 54 to be substantially the same so that the height of each pin contact 50 and the repose position of the curved face section 56 can be maintained substantially constant. Accordingly, reliability of coupling between each pin contact 50 and the ball contact 210 can be improved.

Although the contact holding section 30 determines the angle of the elastic section 54 by contacting on a face in this example, the contact holding section 30 may include a protrusion for determining the distance from the elastic section 54 to the side section of the through-hole 24 to determine the angle of the elastic section 54 by bringing the protrusion into contact with the elastic section 50 in another example.

In addition, according to the test apparatus 100 including the socket 20, it is possible that the electronic device 200 is stably coupled to the main body of the test apparatus 100. For this reason, it is possible that the test of the electronic device 200 is performed efficiently and precisely. Moreover, it is possible that the test of the electronic device 200 operated at a high frequency is performed precisely.

Figure 5:
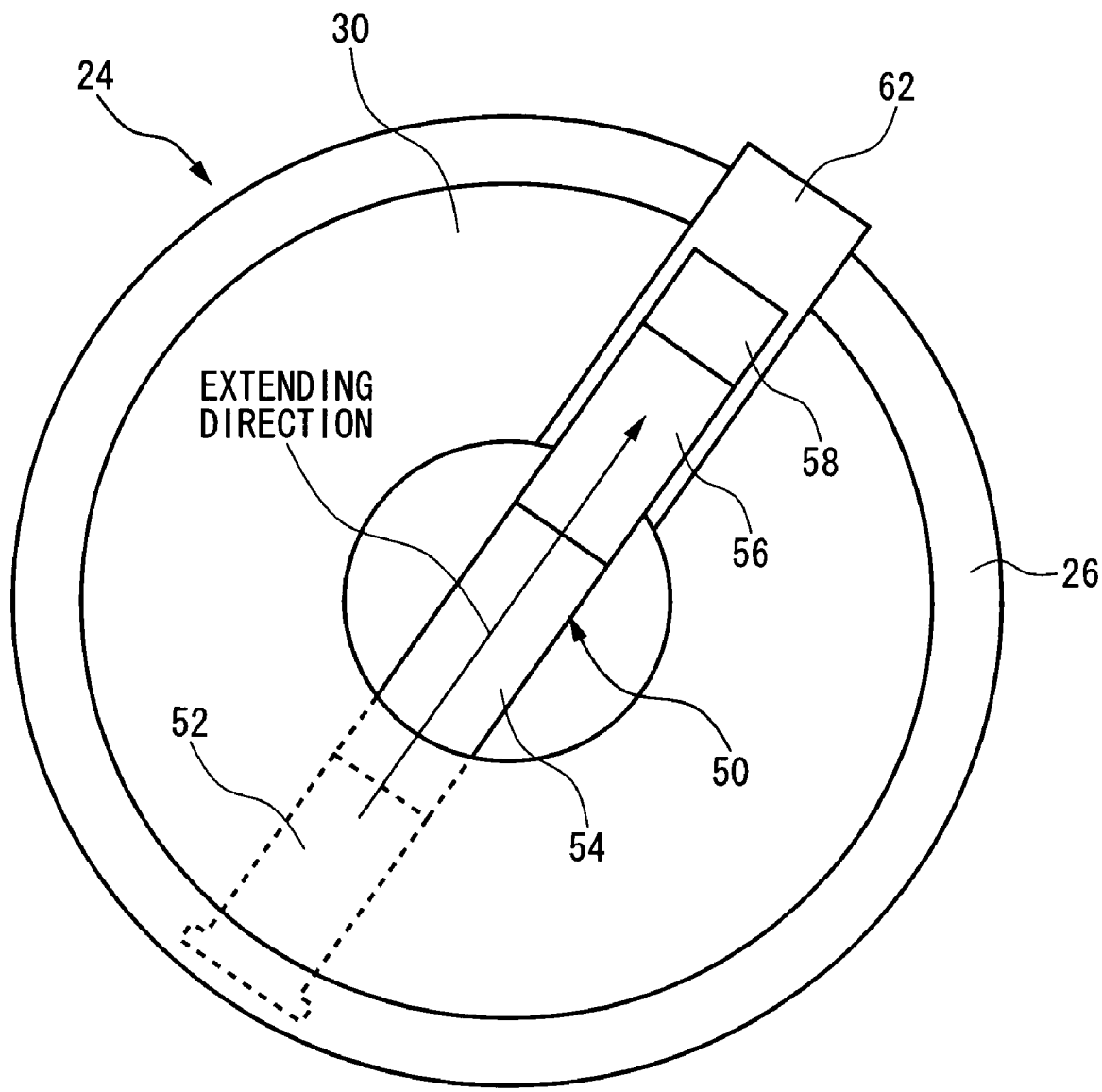
FIG. 5 shows an example of a top view of a through-hole 24 from a surface 34 of a housing 22.

FIG. 5 shows an example of a top view of the through-hole 24 from the surface 34 of the housing 22. In this example, the contact holding section 30 is formed conically. In addition, a groove 62 is formed in order that the curved face section 56 and terminal end section 58 of the pin contact 50 slide on at least a part of the slope face of the contact holding section 30. Moreover, it is desirable that each pin contact 50 is formed in order that the extending direction from the locking section 52 to the curved face section 56 on internal face parallel to the surface 34 of the housing 22 slants regarding the perpendicular and horizontal direction described in FIG. 2.

Figure 6:
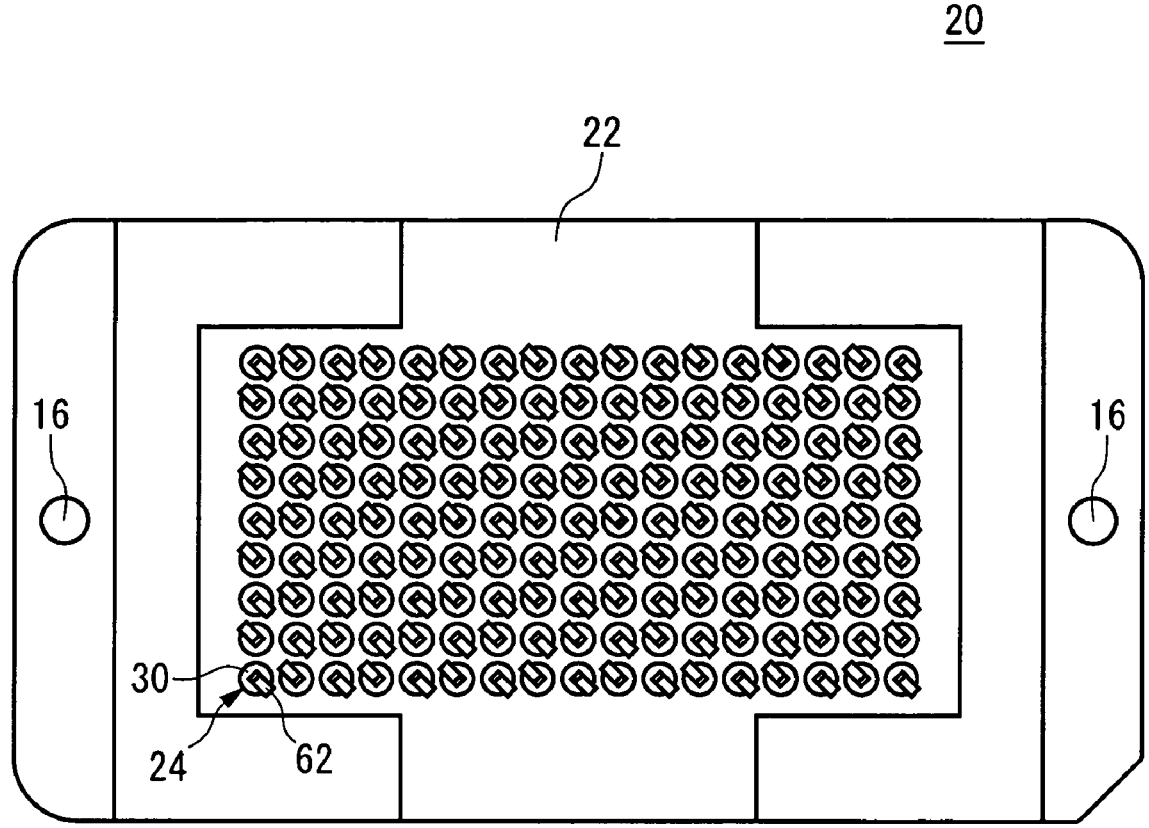
FIG. 6 shows an example of a surface of a housing 22.

FIG. 6 shows an example of a surface view of the housing 22. As shown in FIG. 6, in the each through-hole 24, the groove 62 slants regarding the arranging direction of the through-hole 24. The extending direction of the pin contact 50 slants corresponding to the arranging direction of the through-hole 24 by forming each pin contact 50 in these through-holes 24.

In addition, as shown in FIG. 6, it is desirable that each extending directions of the pin contacts 50, which is provided in the adjacent through-hole, is opposite to each other. Here, the adjacent though-hole 24 is a through-hole 24 having the smallest distance from the adjacent though-hole 24 in the arranging direction of the through-hole 24. Moreover, it is desirable that the direction of the groove 62, which is formed in the through-hole 24, is in opposite to the adjacent through-hole 24. As described above, although the plurality of pin contacts 50 contact the side section of the ball contact 210 respectively, the pressure is balanced in each directions by forming the pin contact 50. That is, the pressing force of a plane direction can be offset. By this, when the electronic device 200 applies pressure on a large number of pin contacts 50, the electronic device 200 can be supported from different directions and aligned in a position where the electronic device 200 can be held stably because the pin contact 50 slides depending on the pressure. For example, in the internal face parallel to the surface 34 of the housing 22, it is possible that the electronic device 200 is aligned in position where the sum of the force between the ball contact 210 and the pin contact 50 is substantially zero and stably coupled to the socket 20. That is, in case of applying pressure, the difference of the position can be prevented because a stress of one direction corresponding to a large number of the ball contacts 210 is offset. In addition, since the extending directions of the pin contacts 50 are opposite to one another, the interference among the signals transmitted by the pin contacts 50 which are provided adjacently can be reduced.

Figure 7:
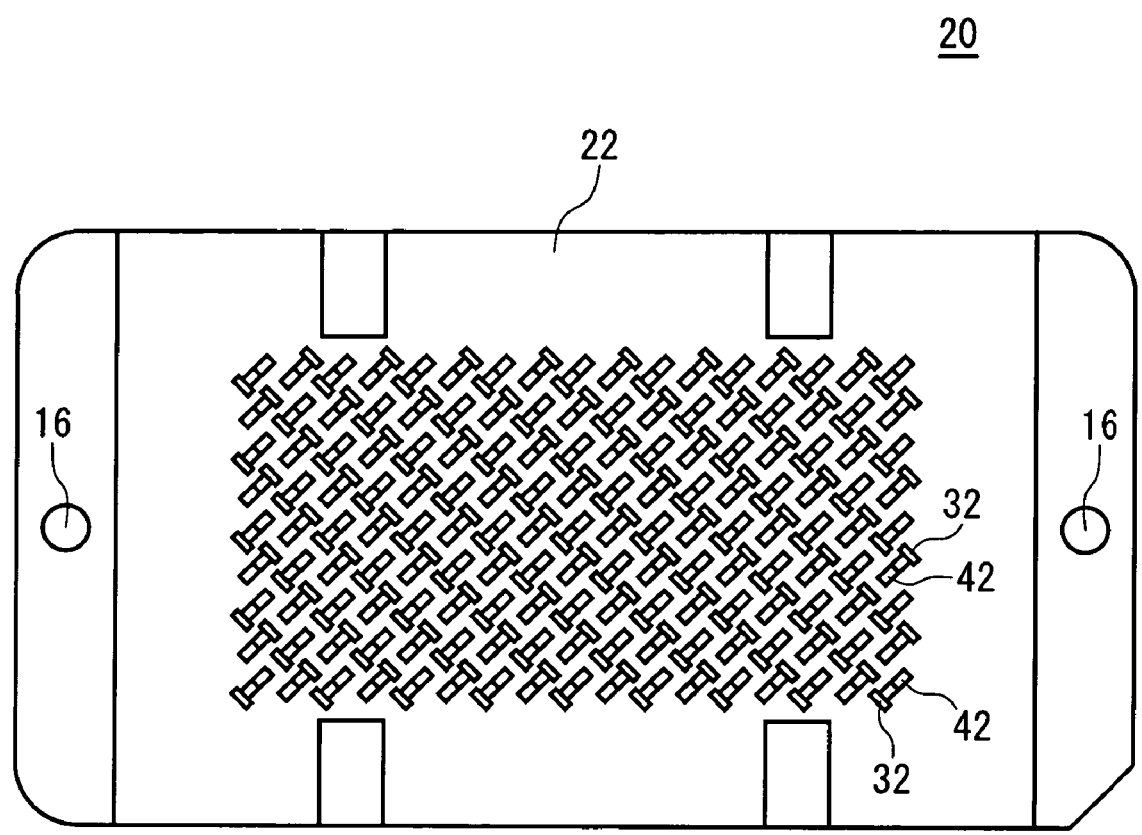
FIG. 7 shows an example of a rear face view of a housing 22.

FIG. 7 shows an example of a rear face view of the housing 22. As shown in FIG. 7, the direction in which the fitting groove 32 is formed corresponding to each through-hole 24 slants in the arranging direction of the through-hole 24 and is an opposite direction to the adjacent through-hole 24 each other.

Figure 8A:
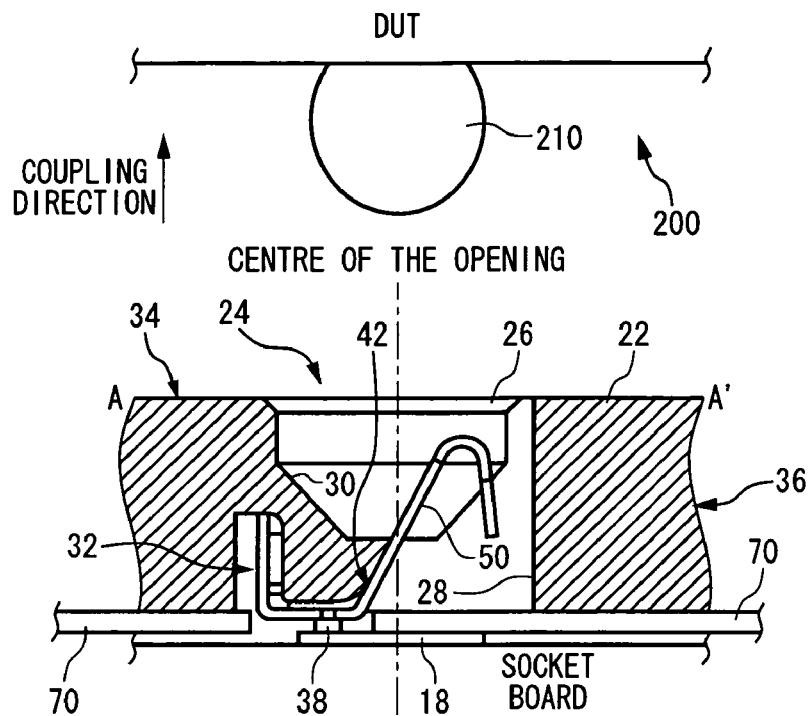
FIG. 8A shows another example of a section of a through-hole 24 according to a housing 22.

FIG. 8 shows another example of the housing 22 and the pin contact 50. FIG. 8A shows a section of the through-hole 24 in the housing 22. For example, FIG. 8A shows a section of a chain line A—A' in FIG. 2.

In this example, the housing 22 holds the pin contact 50 so that the pin contact is freely movable relatively regarding the housing 22 in the coupling direction in which the socket 20 is coupled to the BGA unit and locks towards internal face of which normal line is in the coupling direction. That is, the fitting groove 32 of the housing 22 in this example fixes the locking section 52 of the pin contact 50 with respect to the direction of internal face of which normal line is in the coupling direction, while they are not fixed in the coupling direction. For example, the fitting groove 32 has substantially the same width as that of the locking section 52 towards internal face of which normal line is in the coupling direction so that the pin contact 50 is fixed in the direction. In addition, the fitting groove 32 may have substantially the same depth as the length of the locking section 52 in the coupling direction. By such a configuration, the pin contact 50 is freely movable in a direction in which it falls off the fitting groove.

Accordingly, the housing 22 further includes the locking sheet 70 for preventing the pin contact 50 from completely falling off. The locking sheet 70 is fixed to cover the rear face of the housing 22 and has an opening in a position corresponding to the pin contact 50. That is, the locking sheet 70 is fixed on the face where the fitting groove 32 of the housing 22 is formed and has an opening through which a part of the pin contact 50 including the board-side contacting section 38 is passed.

The locking section 52 of the pin contact 50 includes the first area inserted into the fitting groove 32 and the second area substantially parallel to the rear face of the housing 22. The upper area of a locking section 52 inserted into the fitting groove 32 is wider than the opening and other area of the locking section 52 is smaller than the opening, so that it is possible that the pin contact 50 is held to be freely movable from the position where the upper part of the locking section 52 contacts the locking sheet 70 to the position where the upper end of the locking section 52 contacts the upper part of the fitting groove 32. Here, the upper part of the locking section is the area of the ball contact 210 side in the part inserted into the fitting groove. In addition, since the other configuration of the housing 22 is the same as that of the housing 22 described in FIG. 3, the description is omitted.

Figure 8B:
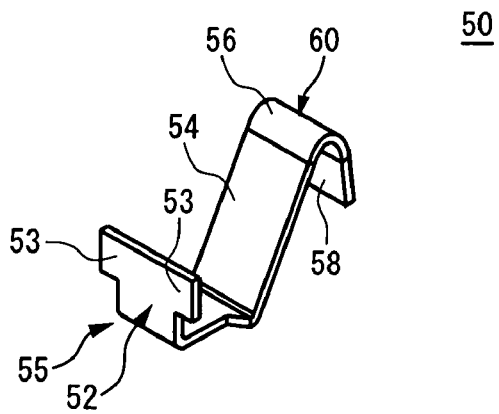
FIG. 8B is a perspective view of a pin contact 50 and FIG. 8C is a perspective view of a pin contact 50 and a locking sheet 70.

FIG. 8B is a perspective view of the pin contact 50. A projecting pieces 53 protruding in a width direction are formed at both ends of an upper part of the locking section in the pin contact 50. It is desirable that the projecting piece 53 should be wider than another section such as the elastic section 54, the curved face section 56 and the terminal end section 58. In addition, the locking section 52 has a cutout portion 55 formed by cutting out both ends of the lower part thereof. Moreover, since the configuration of the pin contact 50 except the locking section 52 is the same as that described in FIG. 3, the description is omitted.

Figure 8C:
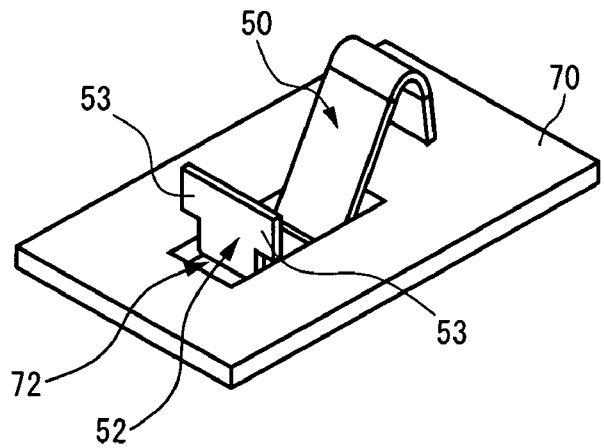

FIG. 8C is a perspective view of the pin contact 50 and the locking sheet 70.

The locking sheet 70 includes an opening 72 through which a part including the board-side contacting section 38 of the pin contact 50 is passed in the position corresponding to the pin contact 50. Although one opening 72 of the locking sheet 70 is shown in FIG. 8C, the locking sheet 70 includes a plurality of openings 72 corresponding to the plurality of pin contacts 50.

The lower part of the locking section 52 where the elastic section 54 and the projecting piece 53 of the pin contact 50 are not formed is narrower than the opening 72 and the upper part of the locking section 52 having the projecting piece 53 is wider than the opening. In addition, it is desirable that he opening 72 is formed in the range longer than the locking section 52. Here, the length of the locking section 52 is the length of the direction in which the pin contact 50 extends on the rear face of the housing 22. According to such configuration, it is possible that the pin contact 50 moves freely from the position where the projecting piece 53 contacts the locking sheet 70 to the position where the upper end of the locking section 52 contacts the upper end of the fitting groove 32 as described above.

Figure 9A:
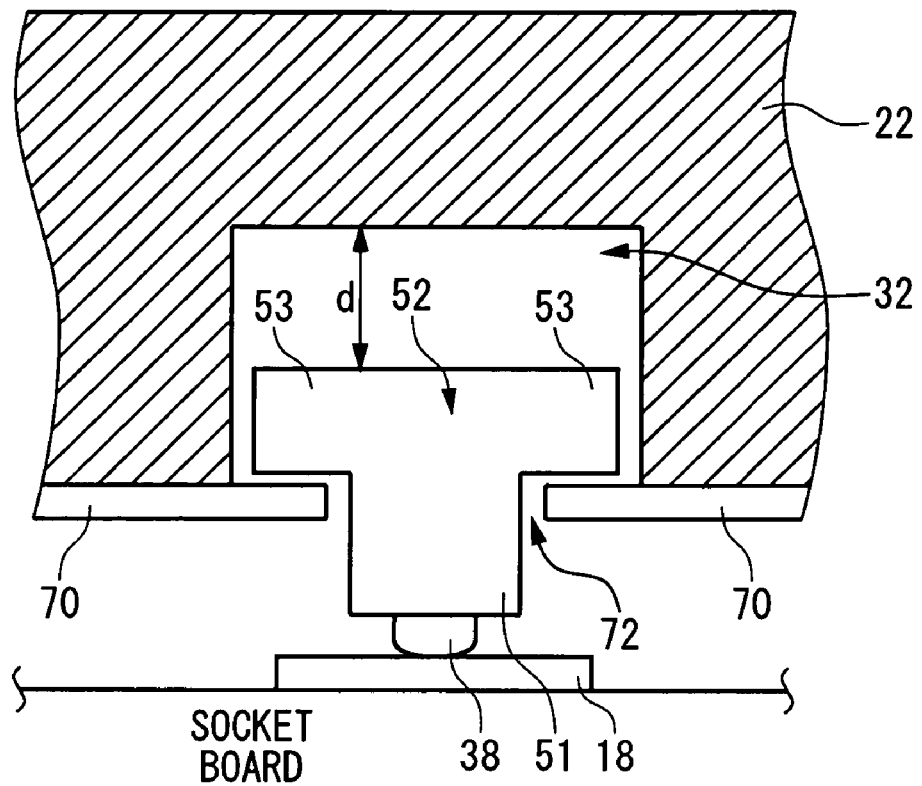
FIG. 9A shows a pin contact 50 moving freely in direction of a terminal 18 of a socket board and FIG. 9B shows a pin contact 50 moving freely in opposite direction of a terminal 18 of a socket board.
Figure 9B:
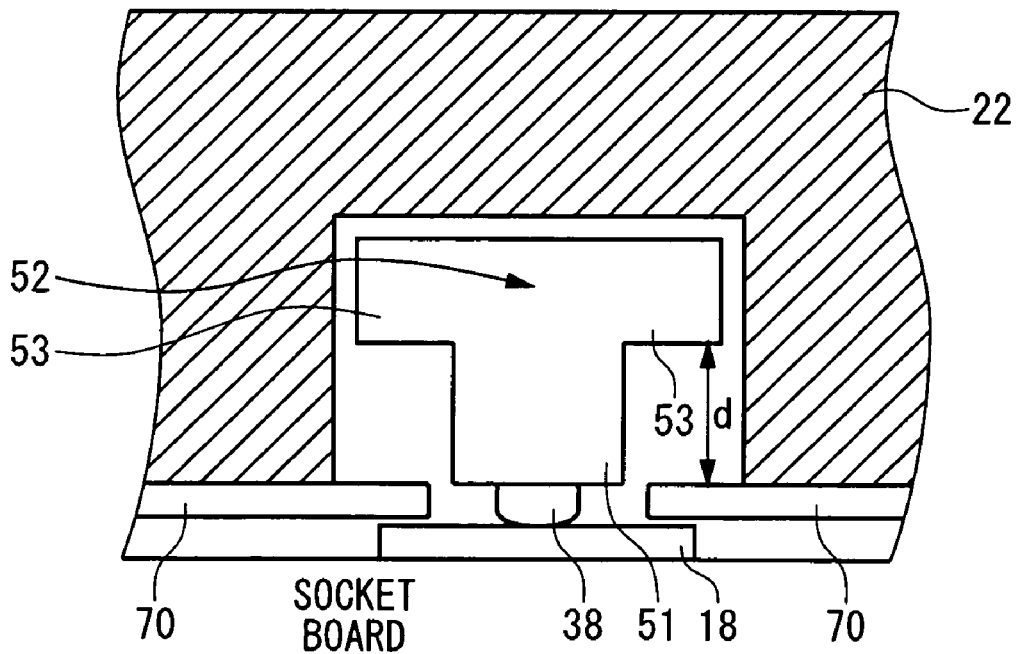

FIG. 9 shows a free movement of the pin contact 50. According to FIG. 9, it is described using the front view of the locking section 52. FIG. 9A shows that the pin contact 50 moves freely in the direction of the terminal 18 of the socket board and FIG. 9B shows that the pin contact 50 moves freely in an opposite direction to the terminal 18 of the socket board.

The ball contact 210 applies pressure on the pin contact 50 towards the terminal 18 of the socket board so that the pin contact 50 is fixed in the coupling direction. However, in case that the difference of the flatness in the socket board or in the housing 22 occurs, the position of the coupling direction of each pin contact 50 may be different.

For example, in case that the temperature stress of about –30 degrees Celsius to +125 degrees Celsius is applied continuously, the housing 22 is curved-transformed due to the temperature stress. In addition, the socket board is also curved-transformed due to the deference in manufacturing or the temperature stress. In such case, if the housing 22 fixes the pin contact 50 in the coupling direction, it is impossible that the pin contact 50 stably contacts the ball contact 210 or the terminal 18 of the socket board.

According to the housing 22 and the pin contact 50 in this example, in case as described above, it is possible that the pin contact 50 stably contacts the ball contact 210 and the socket board because the housing 22 holds the pin contact 50 to be freely movable in the coupling direction. In addition, the locking sheet 70 is formed of materials having heat-resisting property and insulation property, for example, polyimide, an elastic body made of silicon and a sheet made of ceramics.

Figure 10:
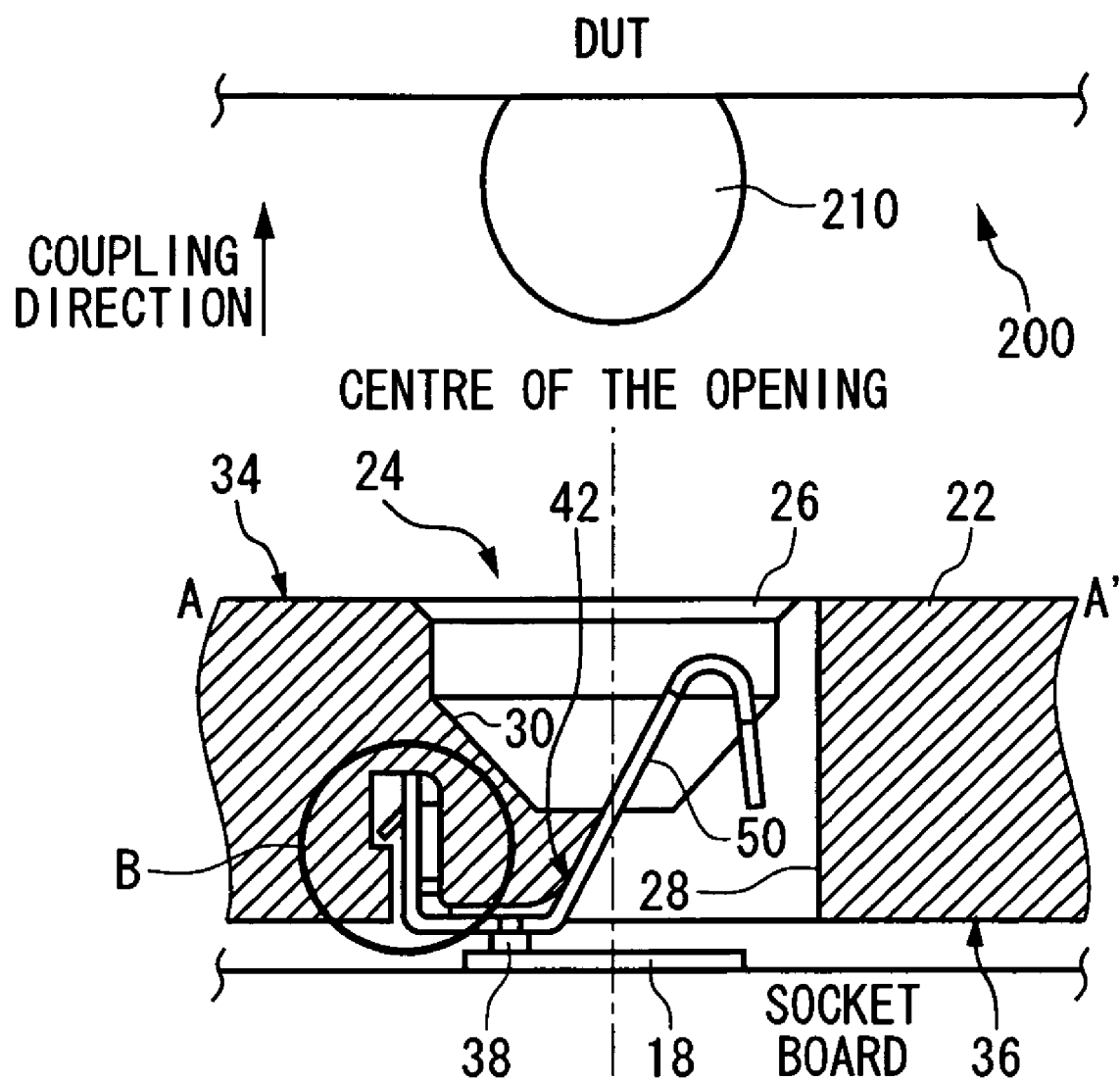
FIG. 10 shows another example of a housing 22 and a pin contact 50.

FIG. 10 shows another example of the housing 22 and the pin contact 50. FIG. 10 shows a section of the chain line from A to A' in FIG. 2. In this example, as shown in FIG. 8, the housing 22 holds the pin contact 50 to be freely movable relative to the housing 22 in the coupling direction in which the socket 20 is coupled to the BGA unit and locks in the direction of internal face of which normal line is in the coupling direction.

Accordingly, in this example, the fitting groove 32 of the housing 22 fixes the locking section 52 of the pin contact 50 regarerding the direction of internal face of which normal line is in the coupling direction, while they are not fixed regarding the coupling direction. In this example, the fitting groove 32 has an substantially same width as that of the locking section 52 in the direction inside of the face of which normal line is in the coupling direction so that it fixes the pin contact 50 in the direction. In addition, the protrusion protruding towards the pin contact 50 on a lower part of the fitting groove 32 is provided. Here, the lower part of the fitting groove 32 is the board-side area of the socket in the fitting groove 32. Since the other configuration of the housing 22 is the same configuration as shown in FIG. 3, the description is omitted.

The pin contact 50 includes a locking claw, which restricts the free movement of the pin contact 50 towards the socket board by contacting the protrusion of the fitting groove on the locking section 52. According to this configuration, the pin contact 50 is held to be freely movable and it is possible that the pin contact 50 is prevented from falling off the fitting groove 32 completely.

Figure 11A:
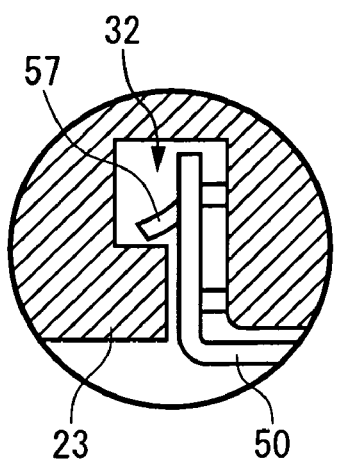
FIG. 11A is an enlarged view of a part B shown in FIG. 10.

FIG. 11 shows an example of the configuration of the pin contact 50 and the fitting groove 32 in FIG. 10. FIG. 11 is an enlarged view of a part B in FIG. 10. As described above, the protrusion 23 is formed at the lower part of the fitting groove 32. The protrusion 23 may be formed in order that it has substantially the same width as the locking section 52 of the pin contact 50 and be arranged in a row.

The pin contact 50 includes the locking claw 57 protruding towards the protrusion 23 on the locking section 52. By this configuration, the pin contact 50 can be held to be freely movable in the coupling direction from the position where the upper end of the locking section 52 contacts the upper end of the fitting groove 32 to the position where the locking claw 57 contacts the protrusion 23. In addition, the depth of the area of the upper part where the protrusion 23 is not formed in the coupling direction is larger than the length from the lower part of the locking claw 57 of the locking section 52 to the upper part of the locking section 52. The pin contact 50 can move freely in the coupling direction by the difference between the depth and the length.

Figure 11B:
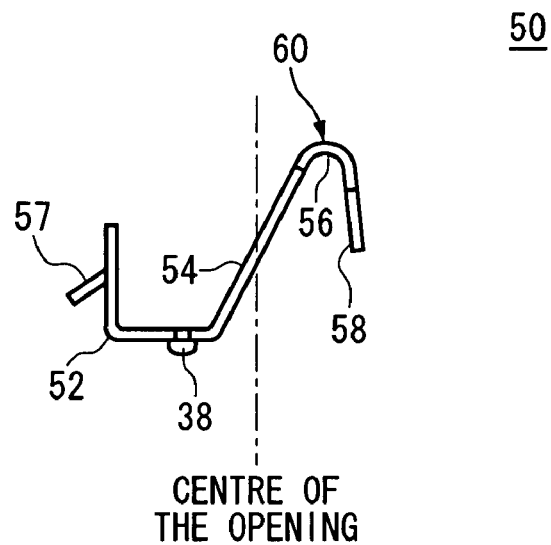
FIG. 11B is a sectional view of a pin contact 50 and FIG. 11C is a perspective view of a pin contact 50.
Figure 11C:
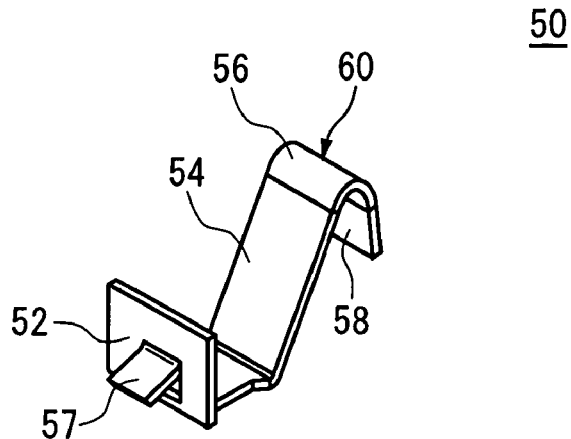

FIG. 11B is a sectional view of the pin contact 50. As described above, the pin contact 50 includes the locking claw 57 on the locking section 52. FIG. 11C is a perspective view of the pin contact 50. As shown in FIG. 11C, the cut-off is formed on three sides out of four sides of the square having a desirable size and the area formed the cut-off is pressed up so that the locking claw 57 may be formed in the locking section 52. In addition, since the configuration of the pin contact 50 except the locking claw 57 is the same configuration as shown in FIG. 3, the description is omitted.

In this example, since the housing 22 holds the pin contact 50 so that the pin contact is freely movable, the pin contact 50 can stably contact the ball contact 210 and the terminal 18 of the socket board.

Although the present invention has been described by way of exemplary embodiments, it should be understood that those skilled in the art might make many changes and substitutions without departing from the spirit and the scope of the present invention which is defined only by the appended claims.

As obvious from the above description, according to the present invention, it is possible to the electronic device is stably coupled to the socket and the damage of the BGA unit is reduced. In addition, it is possible that such a socket is supplied according to the simple configuration of the housing and pin.

What is claimed is:

1. A socket electrically coupled to a BGA unit, which includes a ball contact, comprising:

a housing including a through-hole formed in a surface thereof facing said BGA unit at a position corresponding to said ball contact, said through-hole having a larger diameter than that of said ball contact; and a pin contact provided in said through-hole and contacting a side part of said corresponding ball contact, said pin contact comprising:

a locking section locked on a rear face of said housing;

a curved face section including a curved face to be in contact with said ball contact; and an elastic section extending from said locking section to said curved face section and having an elastic restoring force, wherein said locking section regulates a displacement of said pin contact in a direction perpendicular to a direction to which said elastic section deforms by said curved face section contacting said ball contact.

2. A socket as claimed in claim 1, wherein said BGA unit includes a plurality of said ball contacts, said housing includes a plurality of said through-holes each corresponding to said respective plurality of ball contacts, and said socket includes a plurality of said pin contacts which are provided in said plurality of through-holes.

3. A socket as claimed in claim 2, wherein said pin contact is provided in order that an extending direction of said pin contact, which is directed from said locking section to said curved section, slopes to an arrangement plane of said plurality of through-holes within a plane parallel to a surface of said housing.

4. A socket as claimed in claim 3, wherein said plurality of pin contacts are provided in order that each of said extending directions of said pin contacts, which are provided in said through-holes adjacent to each other, is opposite to each other.

5. A socket as claimed in claim 1, wherein height of an apex of said curved face section in a direction from said housing to said BGA unit is lower than said surface of said housing.

6. A socket as claimed in claim 1 further comprising a contact holding section, which is integrally formed with a side face of said through-hole, configured to set an angle of said elastic section by contacting said elastic section from said locking section side in a state that said pin contact is not in contact with said ball contact.

7. A socket as claimed in claim 6, wherein said contact holding section is conical having a slope face, said contact holding section including a groove formed on at least a part of the slope face.

8. A socket as claimed in claim 7, wherein said groove slants corresponding to the arranging direction of said through-hole.

9. A socket as claimed in claim 7, wherein said groove extends in opposite to that of the adjacent through-hole.

10. A socket as claimed in claim 1, wherein said pin contact further comprises a board-side contacting section formed on a bottom face of an area of said locking section, which is substantially parallel to said rear face of said housing, and electrically contacting an external board, which is electrically coupled to said BGA unit via the board-side contacting section.

11. A socket as claimed in claim 1, wherein said through-hole comprises a cylindrical hole and a conical hole extending from the cylindrical hole.

12. A socket as claimed in claim 1, wherein said through-hole includes a notch formed at an edge of a surface of said housing.

13. A socket as claimed in claim 12, wherein said notch is formed on all corners of the edge of the opening of said through-hole.

14. A test apparatus for testing an electronic device, which comprises a plurality of ball contacts, comprising:
   a socket electrically coupled to said electronic device;
   a pattern generating unit for generating a test pattern to be supplied to said electronic device and supplying said test pattern to said electronic device via said socket; and
   a determining unit for receiving an output signal outputted from said electronic device in response to said test pattern via said socket and determining pass or fail of said electronic device based on said output signal,
   wherein said socket comprises:
      a housing, where a plurality of through-holes having a larger diameter than that of said ball contact are formed in a surface of said housing, which faces said electronic device, in order that said plurality of through-holes correspond to said plurality of ball contacts; and
      a plurality of pin contacts provided in said plurality of through-holes and contacting side parts of said ball contacts,
   wherein said pin contact comprises:
      a locking section locked on a rear face of said housing;
      a curved face section including a curved face to be in contact with said ball contact; and
      an elastic section extending from said locking section to said curved face section and having an elastic restoring force,
      wherein said locking section regulates a displacement of said pin contact in a direction perpendicular to a direction to which said elastic section deforms by said curved face section contacting said ball contact.

15. A test apparatus as claimed in claim 14 further comprising a socket board coupled to a rear face of said socket and receiving and sending a signal between said electronic device and said test apparatus, wherein said pin contact includes a board-side contacting section electrically coupled to said socket.

16. A test apparatus as claimed in claim 15, wherein
   said board-side contacting section is formed on a bottom face of an area of said locking section to be in contact with said rear face of said housing and is in electrical contact with said socket.

* * * * *